(12) United States Patent
Meir et al.

(10) Patent No.: US 8,493,781 B1
(45) Date of Patent: Jul. 23, 2013

(54) INTERFERENCE MITIGATION USING INDIVIDUAL WORD LINE ERASURE OPERATIONS

(75) Inventors: Avraham Meir, Rishon Le-Zion (IL); Eyal Gurgi, Petah-Tikva (IL); Ronen Dar, Tel Aviv (IL); Naftali Sommer, Rishon Lezion (IL); Ofir Shalvi, Ra'anana (IL)

(73) Assignee: Apple Inc., Cupertino, CA (US)

(*) Notice: Subject to any disclaimer, the term of this patent is extended or adjusted under 35 U.S.C. 154(b) by 107 days.

(21) Appl. No.: 13/192,504

(22) Filed: Jul. 28, 2011

Related U.S. Application Data

(60) Provisional application No. 61/372,913, filed on Aug. 12, 2010, provisional application No. 61/380,233, filed on Sep. 5, 2010, provisional application No. 61/469,854, filed on Mar. 31, 2011.

(51) Int. Cl.
*H01L 27/115* (2006.01)

(52) U.S. Cl.
USPC ............. 365/185.02; 365/185.01; 365/185.24

(58) Field of Classification Search
None
See application file for complete search history.

(56) References Cited

U.S. PATENT DOCUMENTS

| | | | |
|---|---|---|---|
| 3,668,631 A | 6/1972 | Griffith et al. |
| 3,668,632 A | 6/1972 | Oldham |
| 4,058,851 A | 11/1977 | Scheuneman |
| 4,112,502 A | 9/1978 | Scheuneman |
| 4,394,763 A | 7/1983 | Nagano et al. |
| 4,413,339 A | 11/1983 | Riggle et al. |
| 4,556,961 A | 12/1985 | Iwahashi et al. |
| 4,558,431 A | 12/1985 | Satoh |
| 4,608,687 A | 8/1986 | Dutton |
| 4,654,847 A | 3/1987 | Dutton |
| 4,661,929 A | 4/1987 | Aoki et al. |
| 4,768,171 A | 8/1988 | Tada |
| 4,811,285 A | 3/1989 | Walker et al. |
| 4,899,342 A | 2/1990 | Potter et al. |
| 4,910,706 A | 3/1990 | Hyatt |
| 4,993,029 A | 2/1991 | Galbraith et al. |
| 5,056,089 A | 10/1991 | Furuta et al. |

(Continued)

FOREIGN PATENT DOCUMENTS

| | | |
|---|---|---|
| EP | 0783754 B1 | 7/1997 |
| EP | 1434236 B1 | 6/2004 |

(Continued)

OTHER PUBLICATIONS

U.S. Appl. No. 12/323,544 Official Action dated Mar. 9, 2012.

(Continued)

*Primary Examiner* — Amir Zarabian
*Assistant Examiner* — James G Norman
(74) *Attorney, Agent, or Firm* — Meyertons, Hood, Kivlin, Kowert & Goetzel, P.C.

(57) ABSTRACT

A method for data storage includes accepting data for storage in a memory that includes multiple analog memory cells. The data is stored in a first group of the memory cells by programming a second group of the memory cells so as to cause the second group to generate interference in the first group, and individually erasing the first group while verifying that analog levels of the memory cells in the first group subject to the interference are within a predefined bound following erasure. After erasing the first group, the first group of the memory cells is programmed with the data.

36 Claims, 5 Drawing Sheets

U.S. PATENT DOCUMENTS

| | | | |
|---|---|---|---|
| 5,077,722 A | 12/1991 | Geist et al. |
| 5,126,808 A | 6/1992 | Montalvo et al. |
| 5,163,021 A | 11/1992 | Mehrotra et al. |
| 5,172,338 A | 12/1992 | Mehrotra et al. |
| 5,182,558 A | 1/1993 | Mayo |
| 5,182,752 A | 1/1993 | DeRoo et al. |
| 5,191,584 A | 3/1993 | Anderson |
| 5,200,959 A | 4/1993 | Gross et al. |
| 5,237,535 A | 8/1993 | Mielke et al. |
| 5,272,669 A | 12/1993 | Samachisa et al. |
| 5,276,649 A | 1/1994 | Hoshita et al. |
| 5,287,469 A | 2/1994 | Tsuboi |
| 5,365,484 A | 11/1994 | Cleveland et al. |
| 5,388,064 A | 2/1995 | Khan |
| 5,416,646 A | 5/1995 | Shirai |
| 5,416,782 A | 5/1995 | Wells et al. |
| 5,446,854 A | 8/1995 | Khalidi et al. |
| 5,450,424 A | 9/1995 | Okugaki et al. |
| 5,469,444 A | 11/1995 | Endoh et al. |
| 5,473,753 A | 12/1995 | Wells et al. |
| 5,479,170 A | 12/1995 | Cauwenberghs et al. |
| 5,508,958 A | 4/1996 | Fazio et al. |
| 5,519,831 A | 5/1996 | Holzhammer |
| 5,532,962 A | 7/1996 | Auclair et al. |
| 5,533,190 A | 7/1996 | Binford et al. |
| 5,541,886 A | 7/1996 | Hasbun |
| 5,600,677 A | 2/1997 | Citta et al. |
| 5,638,320 A | 6/1997 | Wong et al. |
| 5,657,332 A | 8/1997 | Auclair et al. |
| 5,675,540 A | 10/1997 | Roohparvar |
| 5,682,352 A | 10/1997 | Wong et al. |
| 5,687,114 A | 11/1997 | Khan |
| 5,696,717 A | 12/1997 | Koh |
| 5,726,649 A | 3/1998 | Tamaru et al. |
| 5,726,934 A | 3/1998 | Tran et al. |
| 5,799,200 A | 8/1998 | Brant et al. |
| 6,259,627 B1 | 7/2001 | Wong |
| 6,278,632 B1 | 8/2001 | Chevallier |
| 6,314,044 B1 | 11/2001 | Sasaki et al. |
| 6,405,342 B1 | 6/2002 | Lee |
| 6,445,602 B1 | 9/2002 | Kokudo et al. |
| 6,480,948 B1 | 11/2002 | Virajpet et al. |
| 6,490,236 B1 | 12/2002 | Fukuda et al. |
| 6,640,326 B1 | 10/2003 | Buckingham et al. |
| 6,732,250 B2 | 5/2004 | Durrant |
| 6,804,805 B2 | 10/2004 | Rub |
| 6,819,592 B2 | 11/2004 | Noguchi et al. |
| 6,851,081 B2 | 2/2005 | Yamamoto |
| 6,925,009 B2 | 8/2005 | Noguchi et al. |
| 7,006,379 B2 | 2/2006 | Noguchi et al. |
| 7,158,058 B1 | 1/2007 | Yu |
| 7,196,644 B1 | 3/2007 | Anderson et al. |
| 7,196,933 B2 | 3/2007 | Shibata |
| 7,210,077 B2 | 4/2007 | Brandenberger et al. |
| 7,254,763 B2 | 8/2007 | Aadsen et al. |
| 7,266,069 B2 | 9/2007 | Chu |
| 7,272,757 B2 | 9/2007 | Stocken |
| 7,280,415 B2 | 10/2007 | Hwang et al. |
| 7,310,269 B2 | 12/2007 | Shibata |
| 7,310,272 B1 | 12/2007 | Mokhlesi et al. |
| 7,312,727 B1 | 12/2007 | Feng et al. |
| 7,328,384 B1 | 2/2008 | Kulkarni et al. |
| 7,343,330 B1 | 3/2008 | Boesjes et al. |
| 7,365,671 B1 | 4/2008 | Anderson |
| 7,405,974 B2 | 7/2008 | Yaoi et al. |
| 7,409,623 B2 | 8/2008 | Baker et al. |
| 7,433,697 B2 | 10/2008 | Karaoguz et al. |
| 7,434,111 B2 | 10/2008 | Sugiura et al. |
| 7,440,331 B2 | 10/2008 | Hemink |
| 7,447,970 B2 | 11/2008 | Wu et al. |
| 7,450,421 B2 | 11/2008 | Mokhlesi et al. |
| 7,457,163 B2 | 11/2008 | Hemink |
| 7,457,897 B1 | 11/2008 | Lee et al. |
| 7,469,049 B1 | 12/2008 | Feng |
| 7,483,319 B2 | 1/2009 | Brown |
| 7,487,394 B2 | 2/2009 | Forhan et al. |
| 7,526,711 B2 | 4/2009 | Orio |
| 7,558,109 B2 | 7/2009 | Brandman et al. |
| 7,558,839 B1 | 7/2009 | McGovern |
| 7,570,520 B2 * | 8/2009 | Kamei et al. ............ 365/185.19 |
| 7,574,555 B2 | 8/2009 | Porat et al. |
| 7,590,002 B2 | 9/2009 | Mokhlesi et al. |
| 7,609,787 B2 | 10/2009 | Jahan et al. |
| 7,613,043 B2 | 11/2009 | Cornwell et al. |
| 7,616,498 B2 | 11/2009 | Mokhlesi et al. |
| 7,639,532 B2 | 12/2009 | Roohparvar et al. |
| 7,644,347 B2 | 1/2010 | Alexander et al. |
| 7,661,000 B2 | 2/2010 | Ueda et al. |
| 7,661,054 B2 | 2/2010 | Huffman et al. |
| 7,665,007 B2 | 2/2010 | Yang et al. |
| 7,733,712 B1 | 6/2010 | Walston et al. |
| 7,797,609 B2 | 9/2010 | Neuman |
| 7,904,783 B2 | 3/2011 | Brandman et al. |
| 7,929,549 B1 | 4/2011 | Talbot |
| 7,978,516 B2 | 7/2011 | Olbrich et al. |
| 8,014,094 B1 | 9/2011 | Jin |
| 8,037,380 B2 | 10/2011 | Cagno et al. |
| 8,040,744 B2 | 10/2011 | Gorobets et al. |
| 8,065,583 B2 | 11/2011 | Radke |
| 8,238,157 B1 * | 8/2012 | Sommer et al. ......... 365/185.03 |
| 2002/0056064 A1 | 5/2002 | Kidorf et al. |
| 2002/0166091 A1 | 11/2002 | Kidorf et al. |
| 2005/0030788 A1 | 2/2005 | Parkinson et al. |
| 2005/0144361 A1 | 6/2005 | Gonzalez et al. |
| 2006/0106972 A1 | 5/2006 | Gorobets et al. |
| 2007/0104211 A1 | 5/2007 | Opsasnick |
| 2008/0123426 A1 | 5/2008 | Lutze et al. |
| 2009/0193184 A1 | 7/2009 | Yu et al. |
| 2010/0082883 A1 | 4/2010 | Chen et al. |
| 2010/0174847 A1 | 7/2010 | Paley et al. |
| 2010/0211803 A1 | 8/2010 | Lablans |
| 2010/0287217 A1 | 11/2010 | Borchers et al. |
| 2011/0010489 A1 | 1/2011 | Yeh |
| 2011/0060969 A1 | 3/2011 | Ramamoorthy et al. |
| 2011/0066793 A1 | 3/2011 | Burd |
| 2011/0149657 A1 | 6/2011 | Haratsch et al. |
| 2011/0302354 A1 | 12/2011 | Miller |

FOREIGN PATENT DOCUMENTS

| | | |
|---|---|---|
| WO | 9610256 A1 | 4/1996 |
| WO | 9828745 A1 | 7/1998 |
| WO | 2002100112 A1 | 12/2002 |
| WO | 2007046084 A2 | 4/2007 |
| WO | 2007132452 A2 | 11/2007 |
| WO | 2007132453 A2 | 11/2007 |
| WO | 2007132456 A2 | 11/2007 |
| WO | 2007132457 A2 | 11/2007 |
| WO | 2007132458 A2 | 11/2007 |
| WO | 2007146010 A2 | 12/2007 |
| WO | 2008026203 A2 | 3/2008 |
| WO | 2008053472 A2 | 5/2008 |
| WO | 2008053473 A2 | 5/2008 |
| WO | 2008068747 A2 | 6/2008 |
| WO | 2008077284 A1 | 7/2008 |
| WO | 2008083131 A2 | 7/2008 |
| WO | 2008099958 A1 | 8/2008 |
| WO | 2008111058 A2 | 9/2008 |
| WO | 2008124760 A2 | 10/2008 |
| WO | 2008139441 A2 | 11/2008 |
| WO | 2009037691 A2 | 3/2009 |
| WO | 2009037697 A2 | 3/2009 |
| WO | 2009050703 A2 | 4/2009 |
| WO | 2009053961 A2 | 4/2009 |
| WO | 2009053962 A2 | 4/2009 |
| WO | 2009053963 A2 | 4/2009 |
| WO | 2009063450 A2 | 5/2009 |
| WO | 2009072100 A2 | 6/2009 |
| WO | 2009072101 A2 | 6/2009 |
| WO | 2009072102 A2 | 6/2009 |
| WO | 2009072103 A2 | 6/2009 |
| WO | 2009072104 A2 | 6/2009 |
| WO | 2009072105 A2 | 6/2009 |
| WO | 2009074978 A2 | 6/2009 |
| WO | 2009074979 A2 | 6/2009 |
| WO | 2009078006 A2 | 6/2009 |
| WO | 2009095902 A2 | 8/2009 |

OTHER PUBLICATIONS

Chinese Patent Application # 200780026181.3 Official Action dated Mar. 7, 2012.
Chinese Patent Application # 200780026094.8 Official Action dated Feb. 2, 2012.
U.S. Appl. No. 12/332,370 Official Action dated Mar. 8, 2012.
U.S. Appl. No. 12/579,432 Official Action dated Feb. 29, 2012.
U.S. Appl. No. 12/522,175 Official Action dated Mar. 27, 2012.
U.S. Appl. No. 12/607,085 Official Action dated Mar. 28, 2012.
Budilovsky et al., "Prototyping a High-Performance Low-Cost Solid-State Disk", SYSTOR—The 4th Annual International Systems and Storage Conference, Haifa, Israel, May 30-Jun. 1, 2011.
NVM Express Protocol, "NVM Express", Revision 1.0b, Jul. 12, 2011.
SCSI Protocol, "Information Technology—SCSI Architecture Model—5 (SAM-5)", INCITS document T10/2104-D, revision 01, Jan. 28, 2009.
SAS Protocol, "Information Technology—Serial Attached SCSI—2 (SAS-2)", INCITS document T10/1760-D, revision 15a, Feb. 22, 2009.
U.S. Appl. No. 12/323,544 Office Action dated Dec. 13, 2011.
U.S. Appl. No. 12/332,368 Office Action dated Nov. 10, 2011.
U.S. Appl. No. 12/063,544 Office Action dated Dec. 14, 2011.
U.S. Appl. No. 12/186,867 Office Action dated Jan. 17, 2012.
U.S. Appl. No. 12/119,069 Office Action dated Nov. 14, 2011.
U.S. Appl. No. 12/037,487 Office Action dated Jan. 3, 2012.
U.S. Appl. No. 11/995,812 Office Action dated Oct. 28, 2011.
U.S. Appl. No. 12/551,567 Office Action dated Oct. 27, 2011.
U.S. Appl. No. 12/618,732 Office Action dated Nov. 4, 2011.
U.S. Appl. No. 12/649,382 Office Action dated Jan. 6, 2012.
U.S. Appl. No. 13/284,909, filed Oct. 30, 2011.
U.S. Appl. No. 13/284,913, filed Oct. 30, 2011.
U.S. Appl. No. 13/338,335, filed Dec. 28, 2011.
U.S. Appl. No. 13/355,536, filed Jan. 22, 2012.
Kim et al., "Multi-bit Error Tolerant Caches Using Two-Dimensional Error Coding", Proceedings of the 40th Annual ACM/IEEE International Symposium on Microarchitecture (MICRO-40), Chicago, USA, Dec. 1-5, 2007.
Agrell et al., "Closest Point Search in Lattices", IEEE Transactions on Information Theory, vol. 48, No. 8, pp. 2201-2214, Aug. 2002.
Ankolekar et al., "Multibit Error-Correction Methods for Latency-Constrained Flash Memory Systems", IEEE Transactions on Device and Materials Reliability, vol. 10, No. 1, pp. 33-39, Mar. 2010.
Berman et al., "Mitigating Inter-Cell Coupling Effects in MLC NAND Flash via Constrained Coding", Flash Memory Summit, Santa Clara, USA, Aug. 19, 2010.
Bez et al., "Introduction to Flash memory", Proceedings of the IEEE, vol. 91, No. 4, pp. 489-502, Apr. 2003.
Blahut, R.E., "Theory and Practice of Error Control Codes," Addison-Wesley, May 1984, section 3.2, pp. 47-48.
Conway et al., "Sphere Packings, Lattices and Groups", 3rd edition, chapter 4, pp. 94-135, Springer, New York, US 1998.
Chang, L., "Hybrid Solid State Disks: Combining Heterogeneous NAND Flash in Large SSDs", ASPDAC, Jan. 2008.
Cho et al., "Multi-Level NAND Flash Memory with Non-Uniform Threshold Voltage Distribution," IEEE International Solid-State Circuits Conference (ISSCC), San Francisco, CA, Feb. 5-7, 2001, pp. 28-29 and 424.
Compaq et al., "Universal Serial Bus Specification", revision 2.0, Apr. 27, 2000.
Databahn™, "Flash memory controller IP", Denali Software, Inc., 1994 https://www.denali.com/en/products/databahn_flash.jsp.
Datalight, Inc., "FlashFX Pro 3.1 High Performance Flash Manager for Rapid Development of Reliable Products", Nov. 16, 2006.
Duann, N., Silicon Motion Presentation "SLC & MLC Hybrid", Flash Memory Summit, Santa Clara, USA, Aug. 2008.
Eitan et al., "Can NROM, a 2-bit, Trapping Storage NVM Cell, Give a Real Challenge to Floating Gate Cells?", Proceedings of the 1999 International Conference on Solid State Devices and Materials (SSDM), p. 522-524, Tokyo, Japan 1999.
Eitan et al., "Multilevel Flash Cells and their Trade-Offs", Proceedings of the 1996 IEEE International Electron Devices Meeting (IEDM), pp. 169-172, New York, USA 1996.
Engh et al., "A self adaptive programming method with 5 mV accuracy for multi-level storage in Flash", pp. 115-118, Proceedings of the IEEE 2002 Custom Integrated Circuits Conference, May 12-15, 2002.
Engineering Windows 7, "Support and Q&A for Solid-State Drives", e7blog, May 5, 2009.
Goodman et al., "On-Chip ECC for Multi-Level Random Access Memories," Proceedings of the IEEE/CAM Information Theory Workshop, Ithaca, USA, Jun. 25-29, 1989.
Gotou, H., "An Experimental Confirmation of Automatic Threshold Voltage Convergence in a Flash Memory Using Alternating Word-Line Voltage Pulses", IEEE Electron Device Letters, vol. 18, No. 10, pp. 503-505, Oct. 1997.
Han et al., "An Intelligent Garbage Collection Algorithm for Flash Memory Storages", Computational Science and Its Applications—ICCSA 2006, vol. 3980/2006, pp. 1019-1027, Springer Berlin / Heidelberg, Germany, May 11, 2006.
Han et al., "CATA: A Garbage Collection Scheme for Flash Memory File Systems", Ubiquitous Intelligence and Computing, vol. 4159/2006, pp. 103-112, Springer Berlin / Heidelberg, Aug. 25, 2006.
Hong et al., "NAND Flash-based Disk Cache Using SLC/MLC Combined Flash Memory", 2010 International Workshop on Storage Network Architecture and Parallel I/Os, pp. 21-30, USA, May 3, 2010.
Horstein, "On the Design of Signals for Sequential and Nonsequential Detection Systems with Feedback," IEEE Transactions on Information Theory IT-12:4 (Oct. 1966), pp. 448-455.
How to Resolve Bad Super Block: Magic Number Wrong in BSD, Free Online Articles Director Article Base, posted Sep. 5, 2009.

\* cited by examiner

INTERFERENCE MITIGATION USING INDIVIDUAL WORD LINE ERASURE OPERATIONS

CROSS-REFERENCE TO RELATED APPLICATIONS

This application claims the benefit of U.S. Provisional Patent Application 61/372,913, filed Aug. 12, 2010, U.S. Provisional Patent Application 61/380,233, filed Sep. 5, 2010, and U.S. Provisional Patent Application 61/469,854, filed Mar. 31, 2011, whose disclosures are incorporated herein by reference.

FIELD OF THE INVENTION

The present invention relates generally to data storage, and particularly to methods and systems for interference mitigation in analog memory cells.

BACKGROUND OF THE INVENTION

Several types of memory devices, such as Flash memories, use arrays of analog memory cells for storing data. Each analog memory cell stores a quantity of an analog value, also referred to as a storage value, such as an electrical charge or voltage. This analog value represents the information stored in the cell. In Flash memories, for example, each analog memory cell holds a certain amount of electrical charge. The range of possible analog values is typically divided into intervals, each interval corresponding to one or more data bit values. Data is written to an analog memory cell by writing a nominal analog value that corresponds to the desired bit or bits.

Some memory devices, commonly referred to as Single-Level Cell (SLC) devices, store a single bit of information in each memory cell, i.e., each memory cell can be programmed to assume two possible programming levels. Higher-density devices, often referred to as Multi-Level Cell (MLC) devices, store two or more bits per memory cell, i.e., can be programmed to assume more than two possible programming levels.

Flash memory devices are described, for example, by Bez et al., in "Introduction to Flash Memory," Proceedings of the IEEE, volume 91, number 4, April, 2003, pages 489-502, which is incorporated herein by reference. Multi-level Flash cells and devices are described, for example, by Eitan et al., in "Multilevel Flash Cells and their Trade-Offs," Proceedings of the 1996 IEEE International Electron Devices Meeting (IEDM), New York, N.Y., pages 169-172, which is incorporated herein by reference. The paper compares several kinds of multilevel Flash cells, such as common ground, DINOR, AND, NOR and NAND cells.

Eitan et al., describe another type of analog memory cell called Nitride Read Only Memory (NROM) in "Can NROM, a 2-bit, Trapping Storage NVM Cell, Give a Real Challenge to Floating Gate Cells?" Proceedings of the 1999 International Conference on Solid State Devices and Materials (SSDM), Tokyo, Japan, Sep. 21-24, 1999, pages 522-524, which is incorporated herein by reference. NROM cells are also described by Maayan et al., in "A 512 Mb NROM Flash Data Storage Memory with 8 MB/s Data Rate", Proceedings of the 2002 IEEE International Solid-State Circuits Conference (ISSCC 2002), San Francisco, Calif., Feb. 3-7, 2002, pages 100-101, which is incorporated herein by reference. Other exemplary types of analog memory cells are Floating Gate (FG) cells, Ferroelectric RAM (FRAM) cells, magnetic RAM (MRAM) cells, Charge Trap Flash (CTF) and phase change RAM (PRAM, also referred to as Phase Change Memory—PCM) cells. FRAM, MRAM and PRAM cells are described, for example, by Kim and Koh in "Future Memory Technology including Emerging New Memories," Proceedings of the $24^{th}$ International Conference on Microelectronics (MIEL), Nis, Serbia and Montenegro, May 16-19, 2004, volume 1, pages 377-384, which is incorporated herein by reference.

In a typical analog memory cell array, the memory cells are arranged in memory blocks. The rows of each block are associated with respective word lines, and the columns are associated with respective bit lines. Some non-volatile memory systems enable erasure of memory cells belonging to individual word lines, rather than erasure of entire memory blocks.

For example, U.S. Pat. No. 7,551,492, whose disclosure is incorporated herein by reference, describes a non-volatile memory in which less than a full block may be erased as one or more pages. A select voltage is applied through pass transistors to each of plural selected word lines, and an unselect voltage is applied through a pass transistor to each of plural unselected word lines of a selected block. A substrate voltage is applied to the substrate of the selected block. A page erase verify operation may be applied to a block having plural erased pages and plural non-erased pages.

As another example, U.S. Pat. No. 5,995,417, whose disclosure is incorporated herein by reference, describes a non-volatile memory device that includes a plurality of MOS transistors. The transistors are connected to respective word lines to allow individual pages of memory stored in the memory cells on the respective word lines to be erased and erase verified. A method of erasing a page of memory cells includes the steps of applying an erase voltage to one of the MOS transistors to erase the page of memory cells along the respective word line, and applying an initial erase-inhibit floating voltage to other MOS transistors which are connected to the word lines unselected for page erase.

SUMMARY OF THE INVENTION

An embodiment of the present invention that is described herein provides a method for data storage. The method includes accepting data for storage in a memory that includes multiple analog memory cells. The data is stored in a first group of the memory cells by programming a second group of the memory cells so as to cause the second group to generate interference in the first group, and individually erasing the first group while verifying that analog levels of the memory cells in the first group subject to the interference are within a predefined bound following erasure. After erasing the first group, the first group of the memory cells is programmed with the data.

In some embodiments, the memory cells are arranged in rows associated with respective word lines, the first and second groups belong to first and second word lines, respectively, and individually erasing the first group includes individually erasing the first word line. In an embodiment, programming the second group includes predefining an interference-generating value, and programming the memory cells in the second group to the predefined interference-generating value.

In a disclosed embodiment, programming the second group includes programming the memory cells in the second group to the predefined interference-generating value in response to a command to store the data in the first group. In another embodiment, programming the second group includes initializing at least part of a memory block that includes the first and second groups to the interference-generating value. Initializing at least the part of the memory block may include accepting in the memory an initialization command from a controller, and initializing at least the part of the memory block in response to the initialization command.

In yet another embodiment, programming the memory cells in the second group includes setting one or more flags in the memory that indicate whether the second group is programmed to the predefined interference-generating value. In still another embodiment, programming the first group with the data includes programming the first group using a first programming configuration having a first programming time, and programming the second group to the interference-generating value includes programming the second group using a second programming configuration having a second programming time, smaller than the first programming time.

In a disclosed embodiment, programming the second group includes programming multiple word lines of the memory concurrently to the interference-generating value. Programming the multiple word lines may include applying a single respective programming pulse to each of the multiple word lines. In some embodiments, programming the second group to the interference-generating value includes retaining programming levels that were programmed in the second group in a previous block programming operation. In an embodiment, programming the second group includes programming the memory cells of the second group with other data.

In some embodiments, the first group is previously programmed with previous data, and storing the data in the first group includes reading and backing-up the previous data before erasing the first group, and, after erasing the first group, programming the first group with both the data and the backed-up previous data. In a disclosed embodiment, programming the first group includes programming the memory cells in the first group to interim programming levels, subsequently programming at least one memory cell outside the first group, and subsequently re-programming the memory cells in the first group to final programming levels. In an embodiment, programming the first group to the interim programming levels includes caching the data programmed to the first group in a buffer, and re-programming the first group includes re-programming the memory cells in the first group using the data cached in the buffer.

In another embodiment, one of the first and second groups includes the memory cells belonging to even-order word lines of the memory, and the other of the first and second groups includes the memory cells belonging to odd-order word lines of the memory. In yet another embodiment, the memory cells are arranged in rows associated with respective word lines, one of the first and second groups includes even-order memory cells in a given word line, and the other of the first and second groups includes odd-order memory cells in the given word line.

In still another embodiment, the memory is configurable to store the data in one of a first mode in which the first group is individually erased while subject to the interference from the second group, and a second mode in which the first group is only erased during initialization of a memory block to which the first and second groups belong, and storing the data includes accepting from a memory controller a command that indicates a selected one of the modes, and storing the data in the first group using the selected one of the modes.

There is additionally provided, in accordance with an embodiment of the present invention, apparatus for data storage including an interface and storage circuitry. The interface is configured to accept data for storage in a memory that includes multiple analog memory cells. The storage circuitry is configured to store the data in a first group of the memory cells by programming a second group of the memory cells so as to cause the second group to generate interference in the first group, individually erasing the first group while verifying that analog levels of the memory cells in the first group subject to the interference are within a predefined bound following erasure, and, after erasing the first group, programming the first group of the memory cells with the data.

There is also provided, in accordance with an embodiment of the present invention, apparatus for data storage including a memory and storage circuitry. The memory includes multiple analog memory cells. The storage circuitry is configured to store data in a first group of the memory cells by programming a second group of the memory cells so as to cause the second group to generate interference in the first group, individually erasing the first group while verifying that analog levels of the memory cells in the first group subject to the interference are within a predefined bound following erasure, and, after erasing the first group, programming the first group of the memory cells with the data.

The present invention will be more fully understood from the following detailed description of the embodiments thereof, taken together with the drawings in which:

DETAILED DESCRIPTION OF EMBODIMENTS

Overview

Figure 1:
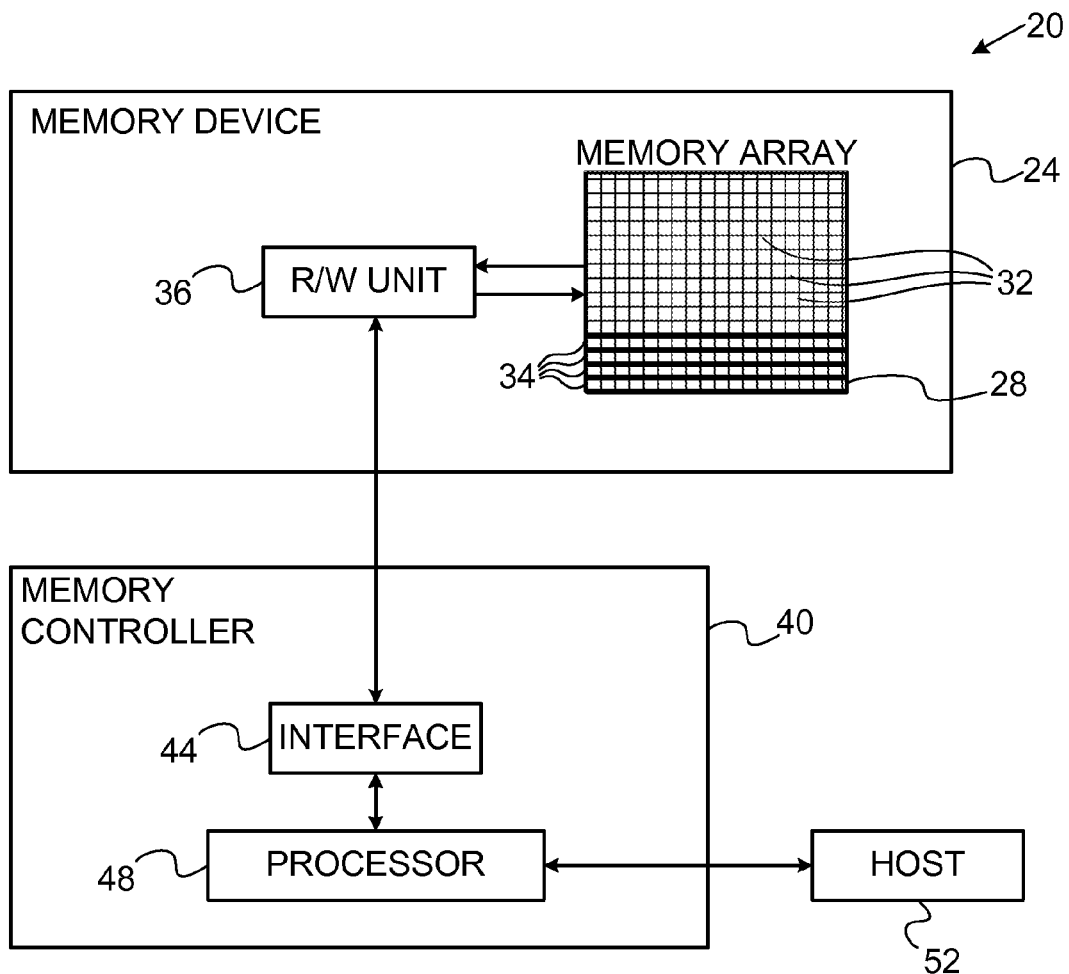
FIG. 1 is a block diagram that schematically illustrates a memory system, in accordance with an embodiment of the present invention.

In a typical analog memory, data is stored in each memory cell by writing into the memory cell an analog value, which is selected from a set of nominal analog values that represent respective data values. The nominal analog values representing the different data values are also referred to as programming levels. Memory cells are erased by setting them to a certain erased level, typically corresponding to a range of negative analog values. Memory cells are often programmed in an iterative Program and Verify (P&V) process that applies a sequence of programming pulses to the memory cells, and verifies the analog values of the memory cells following each pulse. Memory cells that have reached their intended programming levels are inhibited from receiving subsequent programming pulses.

In practical memory devices, memory cells may cause interference to one another, for example because of electric field coupling between them. This interference may cause read errors and degrade the storage reliability of the memory. P&V processes provide some degree of interference mitigation since they compensate for interference that is already present during programming, e.g., interference from previously-programmed memory cells. Additional interference mitigation can be accomplished by programming the memory cells gradually in an interleaved order. Since the interference typically depends on the change in the analog values of the interfering memory cells, interleaved programming orders compensate for the interference that occurs before the programming operation and thus help to further reduce the level of interference.

Erased memory cells, however, are generally unaffected by the above-described interference mitigation mechanisms, because their analog values are not verified during programming. Therefore, memory cells that are set to the erased level are particularly susceptible to interference. Embodiments of the present invention that are described herein provide improved methods and systems for reducing interference in arrays of analog memory cells, and particularly interference to the erased level.

The disclosed techniques reduce interference in a given group of memory cells by erasing the group individually, such that the erasure takes place while at least part of the interference affecting the group is already present. Consider a memory block comprising multiple groups of memory cells, e.g., word lines. When using the disclosed techniques, at least some of the interference that a group of memory cells will receive from other memory cell groups is already present at erasure time. The erasure process typically verifies that the threshold voltages of the erased cells are below a certain negative value. The disclosed techniques ensure that this verification condition is met in the presence of interference. When the memory cells are later programmed with data, additional distortion of the erased level distribution is typically small and tolerable. The disclosed schemes are fundamentally different from some known storage schemes in which erasure is applied to entire memory blocks.

Erasure of individual memory cell groups within a memory block in the presence of interference can be carried out in various ways, and several example processes are described herein. In some embodiments, a target memory cell group in a target word line is programmed by (i) programming memory cells in a neighbor word line, thereby generating interference in the target group, (ii) individually erasing the target word line without erasing the neighbor word line, and (iii) programming the target group with data. In the last programming step, some of the memory cells remain at the erased level because their intended data values are mapped to that level. The disclosed technique reduces the effect of interference to these memory cells.

In one embodiment, all three operations are performed together when preparing to program the target group. In another embodiment, the memory cells of an entire block are initialized to high analog values that generate interference. When preparing to program the target group, the target word line is individually erased and the target group is then programmed with data.

The methods and systems described herein reduce the level of interference in memory cells that are set to the erased level. As a result, the range of analog values allocated to the erased level can be reduced. The remaining range of analog values can be used, for example, to increase the number of programming levels (and thus increase storage density), to increase the separation between adjacent programming levels (thus reducing readout error probability), or to reduce the maximum analog value used for storage (thus increasing memory reliability and lifetime).

System Description

FIG. 1 is a block diagram that schematically illustrates a memory system 20, in accordance with an embodiment of the present invention. System 20 can be used in various host systems and devices, such as in computing devices, cellular phones or other communication terminals, removable memory modules (e.g., "disk-on-key" or "Flash drive" devices), Solid State Disks (SSD), digital cameras, music and other media players and/or any other system or device in which data is stored and retrieved.

System 20 comprises a memory device 24, which stores data in a memory cell array 28. The memory array comprises multiple analog memory cells 32. The memory cells are arranged in memory blocks. In each block, the memory cells are arranged in multiple rows, such that the memory cells in each row are connected to a respective word line 34. The memory cells in each column are connected to a respective bit line.

In the context of the present patent application and in the claims, the term "analog memory cell" is used to describe any memory cell that holds a continuous, analog value of a physical parameter, such as an electrical voltage or charge. Array 32 may comprise solid-state analog memory cells of any kind, such as, for example, NAND, NOR and Charge Trap Flash (CTF) Flash cells, phase change RAM (PRAM, also referred to as Phase Change Memory—PCM), Nitride Read Only Memory (NROM), Ferroelectric RAM (FRAM), magnetic RAM (MRAM) and/or Dynamic RAM (DRAM) cells. Although the embodiments described herein refer mainly to analog memory, the disclosed techniques may also be used with various other memory types.

The charge levels stored in the cells and/or the analog voltages or currents written into and read out of the cells are referred to herein collectively as analog values, storage values or analog storage values. Although the embodiments described herein mainly address threshold voltages, the methods and systems described herein may be used with any other suitable kind of storage values.

System 20 stores data in the analog memory cells by programming the cells to assume respective memory states, which are also referred to as programming levels. The programming levels are selected from a finite set of possible levels, and each level corresponds to a certain nominal storage value. For example, a 2 bit/cell MLC can be programmed to assume one of four possible programming levels by writing one of four possible nominal storage values into the cell.

Memory device 24 comprises a reading/writing (R/W) unit 36, which converts data for storage in the memory device to analog storage values and writes them into memory cells 32. In alternative embodiments, the R/W unit does not perform the conversion, but is provided with voltage samples, i.e., with the storage values for storage in the cells. When reading data out of array 28, R/W unit 36 converts the storage values of memory cells into digital samples having a resolution of one or more bits. Data is typically written to and read from the memory cells in groups that are referred to as pages. In some embodiments, the R/W unit can erase a group of cells 32 by applying one or more negative erasure pulses to the cells. In the erasure process, the R/W unit typically verifies that the analog storage values of the erased cells are within a specified bound following erasure, e.g., below a certain negative erasure threshold, in order to verify that the memory cells are properly erased.

The storage and retrieval of data in and out of memory device 24 is performed by a memory controller 40. Memory controller 40 comprises an interface 44 for communicating with memory device 24, and a processor 48. The disclosed techniques can be carried out by memory controller 40, by R/W unit 36, or both. Thus, in the present context, memory controller 40 and R/W unit 36 are referred to collectively as storage circuitry that carries out the disclosed techniques.

Memory controller 40 communicates with a host 52, for accepting data for storage in the memory device and for outputting data retrieved from the memory device. Memory controller 40 may be implemented in hardware, e.g., using one or more Application-Specific Integrated Circuits (ASICs) or Field-Programmable Gate Arrays (FPGAs). Alternatively, the memory controller may comprise a microprocessor that runs suitable software, or a combination of hardware and software elements.

The configuration of FIG. 1 is an example system configuration, which is shown purely for the sake of conceptual clarity. Any other suitable memory system configuration can also be used. For example, although the example of FIG. 1 shows a single memory device, in alternative embodiments memory controller 40 may control multiple memory devices 24. Elements that are not necessary for understanding the principles of the present invention, such as various interfaces, addressing circuits, timing and sequencing circuits and debugging circuits, have been omitted from the figure for clarity.

In the example system configuration shown in FIG. 1, memory device 24 and memory controller 40 are implemented as two separate Integrated Circuits (ICs). In alternative embodiments, however, the memory device and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory array is disposed. Further alternatively, some or all of the functionality of memory controller 40 can be implemented in software and carried out by a processor or other element of the host system. In some embodiments, host 44 and memory controller 40 may be fabricated on the same die, or on separate dies in the same device package.

In some embodiments, memory controller 40 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

In an example configuration of array 28, memory cells 32 of each block are arranged in multiple rows and columns, and each memory cell comprises a floating-gate transistor. The gates of the transistors in each row are connected by a respective word line 34, and the sources of the transistors in each column are connected by a respective bit line.

The memory array is typically divided into multiple memory pages, i.e., groups of memory cells that are programmed and read simultaneously. Memory pages are sometimes sub-divided into sectors. In some embodiments, each page occupies an entire row of the array, i.e., an entire word line. For two-bit-per-cell devices, for example, each word line stores two pages. In alternative embodiments, each row (word line) can be divided into two or more pages. For example, in some devices each row is divided into two pages, one comprising the odd-order cells and the other comprising the even-order cells. In an example implementation, a two-bit-per-cell memory device may have four pages per row, a three-bit-per-cell memory device may have six pages per row, and a four-bit-per-cell memory device may have eight pages per row.

In a typical embodiment, memory device 24 may comprise thousands of blocks. In a typical two-bit-per-cell MLC device, each block is on the order of 32 word lines, each comprising several tens of thousands of cells. Each word line of such a device may be partitioned into four pages (odd/even order cells, least/most significant bit of the cells). Three-bit-per cell devices having 32 word lines per block would have 192 pages per block, and four-bit-per-cell devices would have 256 pages per block. Alternatively, other block sizes and configurations can also be used. Some memory devices comprise two or more separate memory cell arrays, often referred to as planes. Since each plane has a certain "busy" period between successive write operations, data can be written alternately to the different planes in order to increase programming speed.

Impact of Interference to Erased Level

Figure 2:
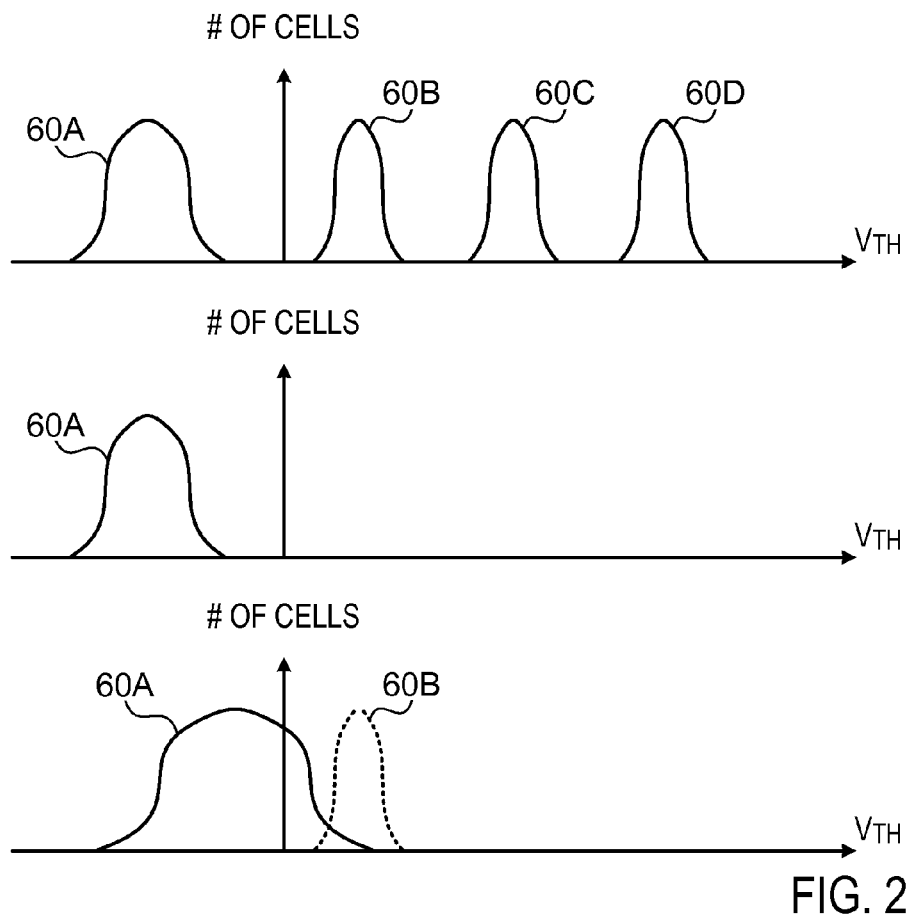
FIG. 2 is a graph showing threshold voltage distributions in a group of analog memory cells, in accordance with an embodiment of the present invention.

FIG. 2 is a graph showing threshold voltage distributions in a group of analog memory cells, in accordance with an embodiment of the present invention. The top graph of FIG. 2 shows the threshold voltage distribution after the group of memory cells is programmed with data and in the absence of strong interference. In the present example, the memory cells comprise four-level cells, each storing two data bits. The four possible data values (e.g., "11", "01", "00" and "10") are represented by four respective programming levels 60A . . . 60D. Each programming level corresponds to a certain range of threshold voltages.

Level 60A also serves as an erased level, meaning that erased memory cells are set to this level. The middle graph of FIG. 2 shows the threshold voltage distribution after the group of memory cells is erased. In the present example the erased level occupies a range of negative threshold voltages.

When strong interference is present, however, the threshold voltages of the erased memory cells may be severely distorted. For example, cross-coupling interference from neighboring word lines may cause the threshold voltage distribution of the erased memory cells to shift and become wider. In some cases, the threshold voltages of some erased memory cells may increase and become positive. This effect may cause read errors and/or reduce the threshold voltage range ("voltage window") that is available for allocation to the other programming levels.

The bottom graph of FIG. 2 shows an example scenario in which erased level 60A became considerably wider and partly positive because of interference from memory cells in neighboring word lines. As can be seen in the figure, level 60A now partially overlaps level 60B, thus increasing the likelihood of read errors. This overlap can be avoided in principle by positioning levels 60B . . . 60D at higher threshold voltages, or by using a smaller number of levels. These solutions, however, degrade storage reliability and/or capacity.

Although the embodiment of FIG. 2 refers to four-level memory cells, this scheme is described purely by way of example. In alternative embodiments, any other number of programming levels per memory cell can be used.

Interference-Resilient Storage Using Individual Word Line Erasure Operations

Embodiments of the present invention provide improved methods and systems for reducing the above-described interference to the erased memory cells. (The term "erased memory cells" refers to memory cells that are part of a cell group that is erased and ready for programming, as well as to memory cells that are programmed with data values that are mapped to the erased level. The top graph in FIG. 2, for example, shows a scenario in which some of the memory cells in a given group remain at the erased level 60A because they are programmed with data values that are mapped to that level.)

The description that follows refers to the disclosed techniques as being carried out by memory controller 40, for the sake of clarity. In alternative embodiments, these techniques can be carried out by R/W unit 36 in memory device 24 or jointly by memory controller 40 and R/W unit 36. Several aspects relating to the interface between memory controller 40 and memory device 24 are addressed further below.

In some embodiments, memory controller 40 reduces the interference to the erased memory cells in a given group of memory cells by erasing the group while at least some of the interference affecting this group is already present (and without erasing the memory cells that generate this interference).

The word line erasure process typically verifies that the threshold voltages of the erased memory cells are within a certain specified bound following erasure, e.g., below a certain erase verification threshold. Erasing the memory cells while at least some of the interference affecting them is already present ensures that the threshold voltages of the memory cells are below the erase verification threshold, while the memory cells are under the effect of interference. When the memory cells are later programmed with data, the residual interference to the memory cells remaining at the erased level will typically be small.

Although the description that follows refers mainly to individual word line erasure, the disclosed techniques can be used with any other suitable group of memory cells.

Figure 3:
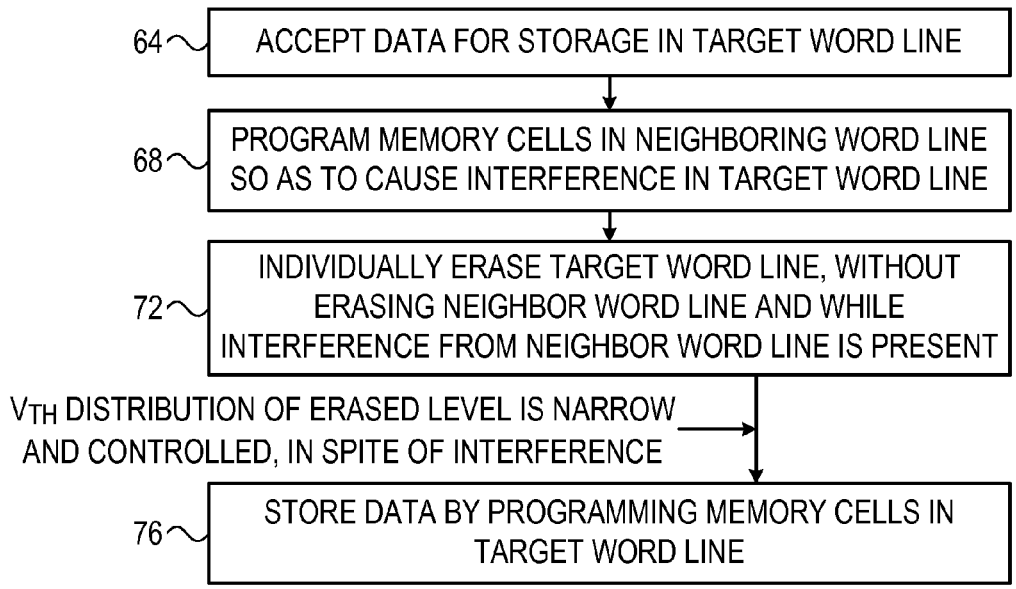
FIGS. 3-7 are flow charts that schematically illustrate methods for data storage using individual word line erasure operations, in accordance with embodiments of the present invention.

FIG. 3 is a flow chart that schematically illustrates a method for data storage using individual word line erasure operations, in accordance with an embodiment of the present invention. The method begins with memory controller 40 accepting from host 52 data for storage, at an input step 64. The data is to be stored in a certain word line, referred to as a target word line, within a given memory block. In this example, the memory controller is assumed to program the word lines in the block in ascending order.

The memory controller programs the word line that follows the target word line (referred to as "neighbor word line") to a high threshold voltage, at a neighbor programming step 68. This high threshold voltage is referred to as an "interference-generating threshold voltage" and it is chosen in order to generate strong interference from the neighbor word line to the target word line. In some embodiments, although not necessarily, the interference-generating threshold voltage comprises the threshold voltage corresponding to the highest programming level (e.g., level 60D in the example of FIG. 2).

At this stage, the memory cells in the target word line are subject to interference both from the preceding word line (which is already programmed since the word lines are programmed in ascending order) and from the following neighbor word line (whose memory cells are programmed to the interference-generating threshold voltage).

While the interference from the two neighbor word lines is present, the memory controller erases the memory cells of the target word line, at an individual erasure step 72. The memory controller erases only the target word line, without erasing neighbor word lines. Any suitable method for individual word line erasure, such as the techniques in the references cited above, can be used for this purpose. In one example embodiment, individual erasure is carried out by applying one or more negative erasure pulses to the word line to be erased, while applying a high positive voltage to the other word lines.

As explained above, step 72 ensures that the threshold voltages of the memory cells in the target word line are properly erased, while they are under the effect of interference from neighboring word lines. After erasing the target word line, memory controller 40 stores the data by programming the memory cells of the target word line, at a storage step 76. The memory controller may continue to apply the storage process of FIG. 3 to subsequent word lines.

When the following neighbor word line is later programmed with real data, the effect of interference from the neighboring word line on the erased memory cells in the target word line depends on the choice of the interference-generating threshold voltage set at step 68. Typically, the erased level distribution in the target word line will be distorted depending on the differences between the analog values of the memory cells in the neighbor word line and the interference-generating threshold voltage.

Consider, for example, an embodiment in which the interference-generating threshold voltage at step 68 is selected to be higher than any threshold voltage that is later programmed in the neighbor word line (i.e., higher than the highest threshold voltage in programming level 60D). In such an embodiment, after programming the neighbor word line with data, the interference will actually cause the erased level in the target word line to become more negative. This effect is typically desirable, for example because the voltage level shifts caused to the erased level do not diminish the voltage range available for the other levels, and because the shifts caused to the non-erased levels can be corrected by the programming operation.

In an alternative embodiment, the interference-generating threshold voltage at step 68 is higher than some, but not all, of the threshold voltages that are later programmed in the neighbor word line. In this embodiment, after programming the neighbor word line with data, the interference may increase the threshold voltages of some of the erased memory cells in the target word line. Nevertheless, this choice of interference-generating threshold voltage may be preferable in certain embodiments, as will be explained below.

Typically, all the memory cells in the neighbor word line are set to the same constant interference-generating threshold voltage. In alternative embodiments, however, the interference-generating threshold voltage may vary from one memory cell to another. Generally, any suitable interference-generating threshold voltage, which approximates at least part of the interference that would be caused by the neighbor word line, can be used.

In an example embodiment, the interference-generating threshold voltage is chosen to be higher than the highest programming level (higher than the upper edge of level 60D in the example of FIG. 2) and lower than the maximum threshold voltage permitted for the memory device (e.g., lower than the pass voltage that is applied to unselected word lines in the memory device). For example, in a memory device whose pass voltage is 6V and the upper edge of the highest programming level is 4.5V, the interference-generating threshold voltage can be set to 5V. In other embodiments, the interference-generating threshold voltage is set at or near 4.5V in order to reduce cell wearing.

Figure 4:
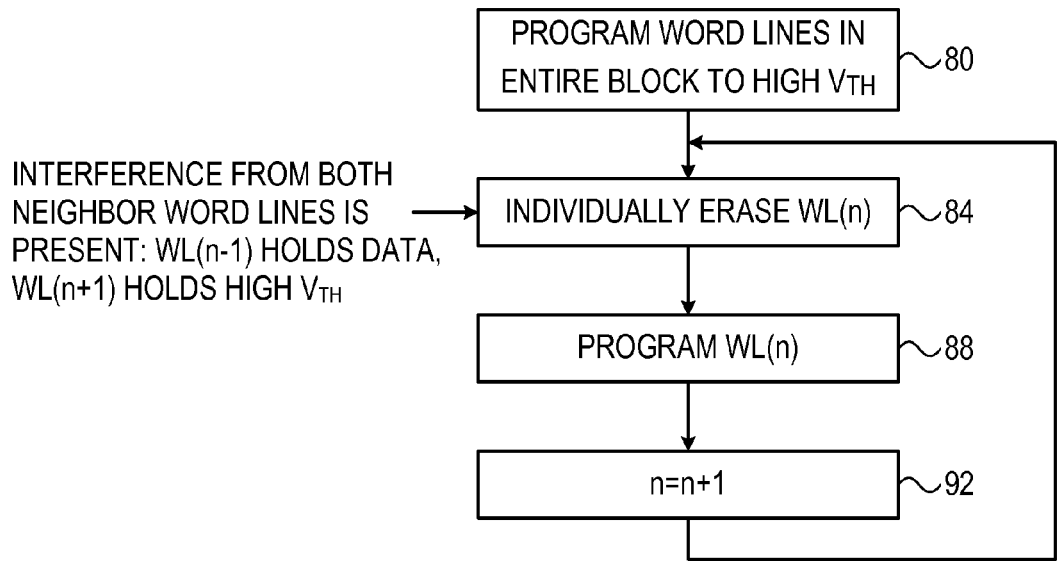

FIG. 4 is a flow chart that schematically illustrates a method for data storage, in accordance with an embodiment of the present invention. The method begins with memory controller 40 initializing all the memory cells in all the word lines of a given memory block to the interference-generating threshold voltage, at an initialization step 80.

When preparing to store data in the memory cells of the $n^{th}$ word line denoted WL(n), the memory controller individually erases this word line, at a word line erasure step 84. This erasure is performed while both neighbor word lines of WL(n) generate interference in WL(n): The preceding word line WL(n−1) is already programmed with data since the word lines are programmed in ascending order, and the following word line WL(n+1) was previously initialized to the interference-generating threshold voltage. Therefore, the erased level of WL(n) following the word line erasure has a narrow and well-controlled threshold voltage distribution, in spite of the interference.

Memory controller 40 now programs the memory cells in WL(n) with data, at a programming step 88. The memory controller increments the word line index, at an incrementing step 92, and the method loops back to step 84 above in order to store data in the next word line.

The method of FIG. 4 initializes the entire memory block to the interference-generating threshold voltage, rather than setting this voltage to individual word lines when preparing to store data. This scheme may be preferable because it achieves short programming time. In alternative embodiments, the memory controller may initialize only part of the block, or any desired set of word lines, to the interference-generating threshold voltage. Another advantage of the method of FIG. 4 is that each memory cell is erased only once per each block programming operation, and not twice. This property is desired in some memory devices in which memory cell aging (wear) increases with the number of Programming/Erasure (P/E) cycles.

Figure 5:
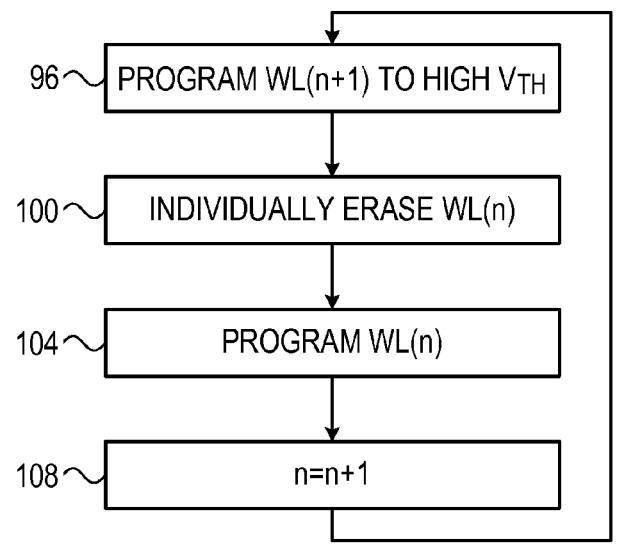

FIG. 5 is a flow chart that schematically illustrates a method for data storage, in accordance with an alternative embodiment of the present invention. In this embodiment, a given word line is initialized to the interference-generating threshold voltage when preparing to program its lower neighbor word line. For example, the given word line may be initialized in response to a command to program the lower neighbor word line.

The method begins with the memory controller preparing to store data in the $n^{th}$ word line, WL(n). The memory controller programs the memory cells in the following word line, WL(n+1), to the interference-generating threshold voltage, at a neighbor programming step 96. At this stage, both WL(n−1) and WL(n+1) generate interference in WL(n), as explained above. Memory controller 40 now erases WL(n), at a word line erasure step 100, and stores the data in WL(n), at a programming step 104. The memory controller increments the word line index, at an incrementing step 108, and the method loops back to step 96 above in order to store data in the next word line.

The method of FIG. 5 may have a longer programming time than the method of FIG. 4, because of the need to set the following word line to the interference-generating threshold voltage. On the other hand, the method of FIG. 5 has improved flexibility, because it can be used to program any word line, whether or not the block was initialized to the interference-generating threshold voltage.

In the embodiments described above, the memory controller programs the word line that follows the target word line to a certain interference-generating threshold voltage. This step, however, is not mandatory. In some embodiments, the memory controller erases the target word line while the preceding word line is already programmed with data, and without first programming the following word line. In these embodiments, the target word line is erased while interference from the preceding word line is present. Although this scheme does not account for interference that would be caused by the following word line, its performance is often acceptable.

Consider, for example, a memory system in which each memory cell holds multiple bits that are used for storing multiple respective pages per word line. In an embodiment, when memory controller 40 prepares to store the $k^{th}$ page in a target word line, the memory controller first reads and backs-up the previously-stored k−1 pages from this word line. Then, the memory controller erases the target word line. At this stage the previous word line is already programmed. After the erasure operation, the memory controller programs all k pages into the target word line. The memory controller may repeat this process for each word line.

In this embodiment, the effect of the page programming order remains, since the erasure and programming operations have no effect from the perspective of the other word lines. The memory controller may program all k pages jointly in a single P&V programming sequence, since the data of all k pages is available at the time of programming. Joint programming of this sort shortens programming time and reduces program disturb effects.

In some conventional page programming orders that map multiple pages to each word line, WL(n+1) is programmed to some extent at the time WL(n) is programmed with its last (highest) page. For example, for a 2 bits/cell memory, when the Most Significant Bit (MSB) page is to be programmed to WL(n), the Least Significant Bit (LSB) page is already programmed to WL(n+1). Therefore, even without programming WL(n+1) explicitly to an interference-generating value, WL(n+1) will still be LSB-programmed and thus generate some interference.

In a variant of the above embodiment, the even-order memory cells of each word line hold one set of k pages, and the odd-order memory cells hold a different set of k pages. Assume also that the word line erasure operations erase an entire word line, including both even- and odd-order memory cells. In such an embodiment, the memory controller may program the $k^{th}$ page in the even-order memory cells in the manner described above. When programming the $k^{th}$ page of in the odd-order memory cells, the memory controller backs-up all the previously-programmed pages in the even- and odd-order memory cells (a total of 2k−1 pages), erases the word line and then programs all pages of the word line (a total of 2k pages). Programming of the 2k pages can be performed in any suitable manner, e.g., using joint programming of the even- and odd-order memory cells together, or by programming the even- and odd-order memory cells alternately in any suitable order.

In some embodiments, each memory cell holds two bits, denoted Least Significant Bit (LSB) and Most Significant Bit (MSB). The LSBs of the memory cells in a given word line are used for storing one page (denoted LSB page), and the MSBs of the memory cells in the word line are used for storing another page (denoted MSB page). In order to reduce interference, the memory controller may program pages into word lines in the following alternating order:

| | |
|---|---|
| Page 0 | LSB of WL (0) |
| Page 1 | LSB of WL (1) |
| Page 2 | MSB of WL (0) |
| Page 3 | LSB of WL (2) |
| Page 4 | MSB of WL (1) |
| Page 5 | LSB of WL (3) |
| Page 6 | MSB of WL (2) |
| Page 7 | LSB of WL (4) |
| ... | ... |

Consider, for example, the memory cells of WL(1). Without using the disclosed techniques, the erased memory cells of WL(1) are subject to interference from both WL(0) and WL(2). Other memory cells of WL(1) are subject only to residual interference caused by MSB programming of WL(2). In some embodiments of the present invention, before programming page 4 into the MSBs of WL(1), the memory controller reads page 1 from the LSBs of WL(1) and backs it up. Then, the memory controller erases WL(1) and programs pages 1 and 4 back into WL(1).

After this stage, the memory cells of WL(1), including both erased and non-erased cells, will be subject to interference only from programming of page 6 into the MSB of WL(2). (When programming page 6, the memory controller will erase WL(2) and the re-program pages 3 and 6 into it, but the interference of page 3 was already present when WL(1) was programmed. This interference is thus compensated by the P&V process.)

In contrast, when using the technique of FIG. 4 above (in which the entire block is initialized to a high interference-generating threshold voltage), the memory controller may program pages into word lines in a monotonically-ascending order such as:

| Page 0 | LSB of WL (0) |
| Page 1 | MSB of WL (0) |
| Page 2 | LSB of WL (1) |
| Page 3 | MSB of WL (1) |
| Page 4 | LSB of WL (2) |
| Page 5 | MSB of WL (2) |
| Page 6 | LSB of WL (3) |
| Page 7 | MSB of WL (3) |
| ... | ... |

Since all the word lines in the block already generate interference to begin with, it is not necessary to reduce interference by using alternating programming orders. As a result, buffering requirements in the memory controller and/or in the memory device can be relaxed. As noted above, re-programming of pages can be carried out in any suitable manner, e.g., using joint programming. This technique can be generalized to schemes that store separate sets of pages in the even- and odd-order memory cells, as explained above.

The above examples refer to 2 bits/cell memory cells. This choice was made, however, purely by way of example. In alternative embodiments, the disclosed techniques can be used with memory cells having any other suitable storage density.

Data Storage Using Word Line Erasure Combined with Re-Programming

In some embodiments, memory controller 40 programs the memory cells of a target word line in two programming phases, in order to reduce interference. In the first programming phase, the memory controller programs the memory cells of the target word line to interim programming levels that are slightly lower than the final intended programming levels. Then, the memory controller applies the first programming phase to a neighbor word line, thus causing them to generate interference in the target word line. Then, the memory controller returns to the target word line and programs it to the final programming levels in a second programming phase. The second programming phase is sometimes referred to as re-programming.

Programming the memory cells in this interleaved and gradual manner ensures that when the target word line is programmed in the second programming phase, its neighbor word lines already generate most of the interference affecting the target word line. The P&V process in the second phase will therefore compensate for this interference. The residual interference, caused by applying the second programming phase to the next word line, will typically be small.

In some embodiments, memory controller 40 stores data in a process that combines the above-described re-programming process with individual word line erasure. Such a combined process reduces interference both in the erased level and in the other programming levels.

Figure 6:
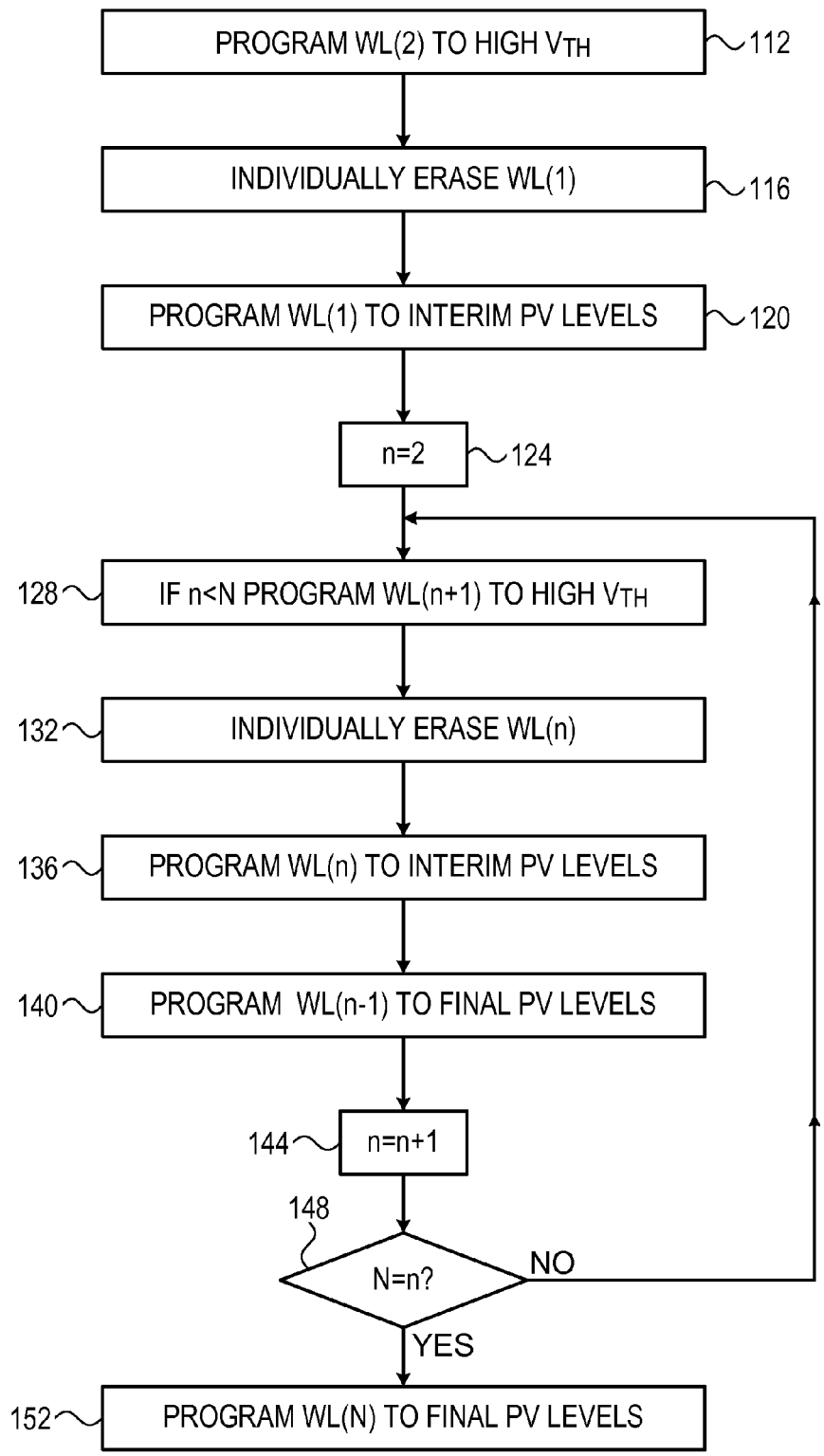

FIG. 6 is a flow chart that schematically illustrates a data storage method combining re-programming with individual word line erasure, in accordance with an embodiment of the present invention. The method of FIG. 6 describes a process that programs a set of N word lines denoted WL(1) . . . WL(N).

The method begins with memory controller 40 preparing to program WL(1) by setting the memory cells of WL(2) to the interference-generating threshold voltage, at a WL(2) setting step 112. The memory controller then individually erases WL(1), at a WL(1) erasure step 116. The memory controller programs WL(1) to the interim programming levels, at an interim WL(1) programming step 120, and sets the word line index n to be n=2, at a setting step 124.

As long as n<N, memory controller 40 programs WL(n+1) to the interference-generating threshold voltage, at a WL(n+1) setting step 128. The memory controller erases WL(n), at a WL(n) erasure step 132, and programs WL(n) to the interim programming levels, at an interim WL(n) programming step 136. The memory controller then goes back to WL(n−1) and programs it from the interim programming levels to the final programming levels, at a WL(n−1) re-programming step 140.

The memory controller increments the word line index n, at an incrementing step 144, and checks whether n=N, at a completion checking step 148. If not, i.e., if n has not yet reached N, the method loops back to step 128 above. Otherwise, the memory controller programs WL(N) to the final programming levels, at a WL(N) re-programming step 152, and the method terminates.

The method of FIG. 6 may cause relatively long programming times, because of the need to erase word lines and set word lines to the interference-generating threshold voltage as part of the programming process. Similarly to the method of FIG. 4 above, programming time can be shortened by initially setting some or all the word lines to the interference-generating threshold voltage.

In any of the techniques disclosed herein, memory controller 40 may take various measures for reducing the time needed for programming word lines to the interference-generating threshold voltage. For example, the memory controller may take advantage of the fact that this programming operation typically has lower accuracy requirements relative to programming operations that store data. Thus, in some embodiments the memory controller may program word lines to the interference-generating threshold voltage using a programming configuration having coarser accuracy than the programming configuration used for data storage operations.

In one example embodiment, the memory controller programs word lines to the interference-generating threshold voltage using a P&V process in which the amplitude increment between successive pulses is larger than that used for data storage programming operations. The larger increment increases the programming speed considerably, at the expense of some tolerable degradation in programming accuracy.

As another example, when programming word lines to the interference-generating threshold voltage, the memory controller may terminate the P&V process after fewer P&V pulses than the maximum number of P&V pulses used for data storage programming operations. Note also that the readout operation used for verifying the interference-generating threshold voltage is relatively fast, since it involves only a single read threshold. This readout operation is typically much faster than MLC data readout operations that sometimes involve comparison to multiple read thresholds. In summary, the programming operation that programs word lines with the interference-generating threshold voltage can be defined so as to incur only minimal programming time overhead.

In some embodiments, the memory controller retains the threshold voltages of the memory cells in a given word line from a previous programming operation, and lets these values serve as interference-generating threshold voltages. In other words, the memory controller does not erase a given memory block en-bloc when preparing to store data in the block. Instead, the memory controller uses the individual word line erasure techniques described herein, while letting the existing threshold voltages of memory cells in adjacent word lines serve as interference-generating threshold voltages. In the method of FIG. 6, for example, this technique would omit steps 112 and 128, and the block in question is not erased prior to programming.

In any of the techniques disclosed herein, memory controller 40 and R/W unit 36 may program multiple word lines to the interference-generating threshold voltage simultaneously. Simultaneous programming of this sort reduces programming latency and power consumption considerably. Simultaneous programming of word lines to the interference-generating threshold voltage can be used, for example, instead of the individual programming operations of step 80 of FIG. 4, step 96 of FIG. 5, steps 112 and 128 of FIG. 6, as well as step 156 of FIG. 7 further below.

System 20 may use various techniques for programming multiple word lines simultaneously to the interference-generating threshold voltage. In some embodiments, the R/W unit applies to each word line a single respective programming pulse without verification, such that multiple word lines are programmed simultaneously. The pulse amplitude may vary from one word line to another. Single-pulse programming of this sort is described, for example, in U.S. Pat. No. 7,924,587, entitled "Programming of analog memory cells using a single programming pulse per state transition," whose disclosure is incorporated herein by reference.

Any of the programming techniques described in this reference may be used for simultaneous programming of word lines to the interference-generating threshold voltage, e.g., to all the word lines of a given memory block. Although single-pulse programming typically produces a relatively wide threshold voltage distribution, such a distribution is typically tolerable and enables high-performance interference mitigation. Typically although not necessarily, the system programs the word lines of a given memory block to the interference-generating threshold voltage before starting to store data in the block.

Figure 7:
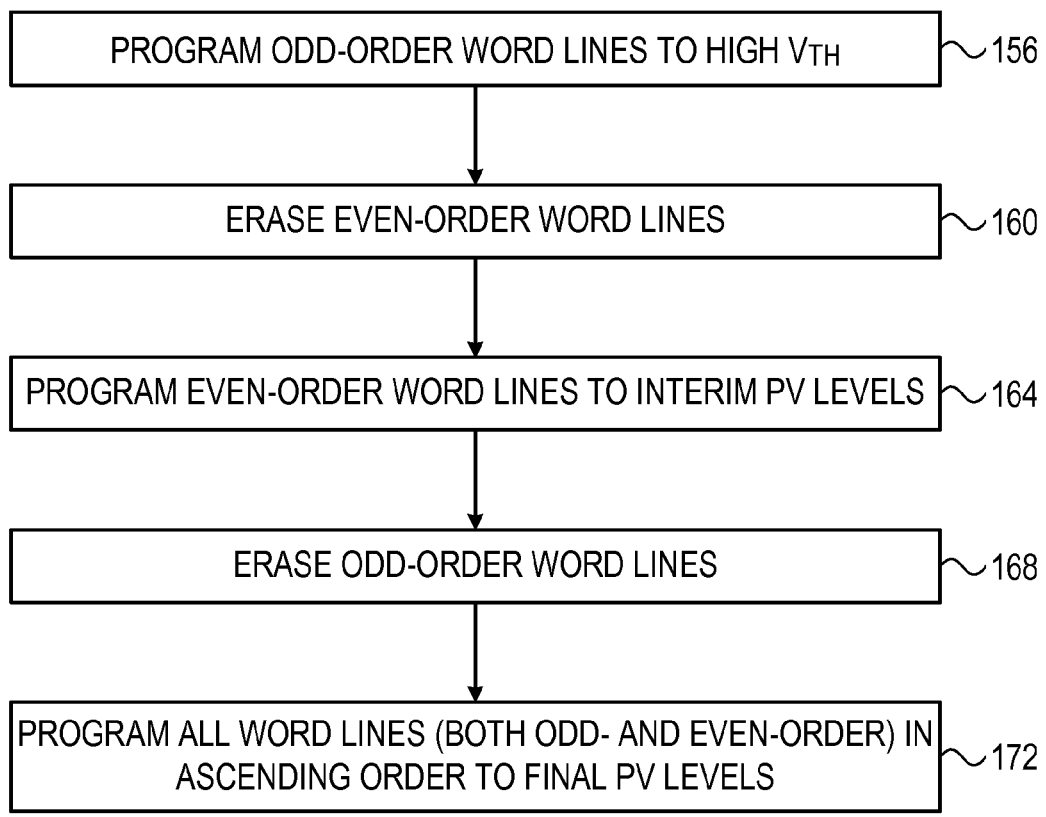

FIG. 7 is a flow chart that schematically illustrates a data storage method combining re-programming with individual word line erasure, in accordance with an alternative embodiment of the present invention. This method further shortens the data programming time by erasing or programming multiple word lines (possibly all word lines) simultaneously.

The method begins with memory controller 40 setting the odd-order word lines WL(1), WL(3), WL(5) . . . to the interference-generating threshold voltage, at an odd-order setting step 156. The memory controller then erases the even-order word lines, at an even-order erasure step 160. This erasure is performed while each even-order word line is subject to interference from its two odd-order neighbor word lines (which have been set to the interference-generating threshold voltage at step 156 above). The memory controller then programs the even-order word lines to the interim programming levels, at an even interim programming step 164.

Memory controller 40 now erases the odd-order word lines, at an odd-order erasure step 168. This erasure is performed while each odd-order word line is subject to interference from its two even-order neighbor word lines (which have been programmed to the interim programming levels at step 164 above). The memory controller then programs all word lines (both odd- and even-order word lines) in ascending order to the final programming levels, at a re-programming step 172.

The method of FIG. 7 typically achieves faster programming times than the method of FIG. 6 above. For example, the word line erasure operations for the entire block can be implemented using only two commands from memory controller 40 to memory device 24—One command for erasing the even-order word lines and one for erasing the odd-order word lines.

Step 172 may be carried out in an interleaved and gradual manner, in which WL(n) is programmed to the final programming levels only after WL(n−1) is programmed to the interim programming levels. Programming orders of this sort reduce interference, as explained above. Each of steps 156, 160 and 168 can be applied to multiple word lines simultaneously, possibly using a single command from memory controller 40 to memory device 24. Some simulation results of the method of FIG. 7 are provided in U.S. Provisional Patent Application 61/380,233, cited above.

When carrying out the above-described methods, cells are initially set to the interference-generating threshold voltage, which is later replaced by programming with real data. The replacement may decrease the threshold voltages of the memory cells in neighboring word lines. This effect is referred to as "negative interference."

In the methods of FIGS. 6 and 7, however, this decrease is compensated for by the re-programming phase (the second programming phase that programs the memory cells to their final programming levels). In some embodiments, the interim programming levels can have the same values as the respective final programming levels, since the threshold voltages between the first and second programming phases are decreased as a result of negative interference.

In some implementations of the methods of FIGS. 6 and 7, a given word line is programmed from the interim programming levels to the final programming levels by reading the interim programming levels, reconstructing the data and then re-programming it. In some cases, however, the interim programming levels may be severely distorted by subsequent programming and word-line erasure operations. This distortion may prevent reliable reconstruction of the data before re-programming. Thus, in some embodiments, the data to be stored is cached in a suitable buffer in memory device 24 until it is fully programmed to the final programming levels. This buffer may comprise, for example, a group of Single Level Cells (SLC) memory cells in which data is stored using only two programming levels. In these embodiments, the memory device re-programs the data using the data cached in the buffer and not by reading the interim programming levels.

In alternative embodiments, the negative interference to the non-erased memory cells can be compensated for during data readout from the memory cells. For example, when reading a target word line, the memory controller may read one or more neighboring word lines, calculating the interference they cause to the memory cells of the target word line, and accounting for this interference when recovering the data from the target word line.

Note that the methods of FIGS. 3-7 may relieve the memory controller of the need to erase memory blocks in order to prepare them for programming, since word line erasure is performed as part of the programming process. This feature may simplify the memory management tasks considerably, and prevent degradation to the endurance of the memory due to multiple erase operations.

The embodiments described herein refer to erasure of individual word lines. In alternative embodiments, however, the disclosed techniques can be used with erasure at other granularities, of other suitable groups of memory cells. For example, some memory systems store data separately in the even-order memory cells and in the odd-order of each word line. In some embodiments, the odd-order memory cells can be erased separately of the even-order memory cells, and vice versa. The programming schemes of FIGS. 3-7 above can be carried out, mutatis mutandis, such that the groups of memory cells being programmed and erased comprise Half Word Lines (HWL), e.g., the even-order or odd-order memory cells in each word line. In this context, the odd-order and even-order memory cells in a given word line may be treated similarly to neighboring word lines. This technique can compensate for the effect of interference from horizontal neighbors located in the same word line.

Memory Controller/Memory Device Interface Considerations

As noted above, the programming schemes described herein can be partitioned between memory controller 40 and R/W unit 36 of memory device 24 in various manners. In some embodiments, the memory controller and memory device support a command interface comprising one or more commands that facilitate the disclosed techniques.

For example, in some embodiments the memory controller sends to the memory device a command that instructs the memory device to program the memory cells of a given memory block to the interference-generating threshold voltage. Alternatively, the command may specify a subset of the word lines in the block that are to be set to the interference-generating threshold voltage. The actual value of the interference-generating threshold voltage may be predefined, or it may be specified to the memory device as part of the command.

As described above, in some embodiments programming to the interference-generating threshold voltage is carried out using a programming configuration that is different from the one used for data storage programming operations. In these embodiments, the command from the memory controller to the memory device may indicate the desired programming configuration.

In response to the command, R/W unit 36 programs the specified memory block (or a specified part thereof) to the interference-generating threshold voltage. The command may be executed in the memory device by programming one word line (or page) at a time. Alternatively, the command may be executed by programming multiple word lines (or even all word lines) in parallel. As explained above, for example, R/W unit 36 may apply single-pulse programming without verification to multiple word lines concurrently.

In some embodiments, R/W unit executes the command, i.e., sets an entire block to the interference-generating threshold voltage, by performing the following steps:

Erase the memory cells of the whole block until X % of the memory cells reach threshold voltages that are below a certain value. This step controls the upper edge of the threshold voltage distribution of the memory cells. The verification in this step is typically performed for all word lines in parallel. In such an embodiment, some word lines may be over-erased.

Program the memory cells (using a P&V process) to the interference-generating threshold voltage. This step controls the lower edge of the threshold voltage distribution of the memory cells, and is typically performed in each word line separately.

In some scenarios, a memory block may undergo a certain retention period after it is initialized to the interference-generating threshold voltage and before it is programmed with data. The retention may cause the threshold voltages of some of the memory cells to decrease. Thus, in some embodiments, the memory controller or the R/W unit verifies that WL(n+1) is programmed to the desired level before individually-erasing and programming WL(n).

In some known memory devices, readout from an erased block returns "FF" data values. In some embodiments, after a block is programmed to the interference-generating threshold voltage, the memory device returns a certain data value (typically different from "FF") that is agreed upon between the memory controller and the memory device. The returned value may depend on the actual value of the interference-generating threshold voltage, and on the read sequence carried out by the memory device.

In an embodiment, one or more flag bits may be defined for each word line, for indicating whether the word line is programmed to the interference-generating threshold voltage. These flag bits of a given word line are typically stored in one or more of the memory cells of that word line and can be read by the memory controller. The memory controller and the memory device may support a command, using which the memory controller reads the flag bits of a given word line and thus determines whether the word line is set to the interference-generating threshold voltage.

Typically, the flag bits indicate whether at least a predefined (and typically configurable) number of the memory cells in the word line have successfully reached the interference-generating threshold voltage. This condition may also serve as the success criterion for the command that sets a block to the interference-generating threshold voltage.

In some embodiments, memory device 24 is configurable to operate in one of two operational modes—An individual word line erasure mode that stores data using the individual word line erasure methods described herein, and a conventional mode that stores data using entire block erasures. In an embodiment, memory controller 40 sends the memory device a command that instructs the memory device which of the operational modes to use for storing data.

It will be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method for data storage, comprising:
accepting data for storage in a memory that includes multiple analog memory cells; and
storing the data in a first group of the memory cells, by:
programming a second group of the memory cells to a predefined high interference-generating threshold voltage wherein the predefined high interference-generating threshold voltage generates interference from the second group to the first group;
individually erasing the first group without erasing the second group, thereby subjecting the first group to interference from the second group;
verifying that analog levels of the memory cells in the first group subject to the interference are within a predefined bound following erasure; and
after erasing the first group, programming the first group of the memory cells with the data.

2. The method according to claim 1, wherein the memory cells are arranged in rows associated with respective word lines, wherein the first and second groups belong to first and second word lines, respectively, and wherein individually erasing the first group comprises individually erasing the first word line.

3. The method according to claim 1, wherein programming the second group comprises programming the memory cells in the second group to the predefined interference-generating value in response to a command to store the data in the first group.

4. The method according to claim 1, wherein programming the second group comprises initializing at least part of a memory block that comprises the first and second groups to the interference-generating value.

5. The method according to claim 4, wherein initializing at least the part of the memory block comprises accepting in the memory an initialization command from a controller, and initializing at least the part of the memory block in response to the initialization command.

6. The method according to claim 1, wherein programming the memory cells in the second group comprises setting one or more flags in the memory that indicate whether the second group is programmed to the predefined interference-generating value.

7. The method according to claim 1, wherein programming the second group comprises programming multiple word lines of the memory concurrently to the interference-generating value.

8. The method according to claim 7, wherein programming the multiple word lines comprises applying a single respective programming pulse to each of the multiple word lines.

9. The method according to claim 1, wherein programming the second group to the interference-generating value comprises retaining programming levels that were programmed in the second group in a previous block programming operation.

10. The method according to claim 1, wherein programming the second group comprises programming the memory cells of the second group with other data.

11. The method according to claim 1, wherein the first group is previously programmed with previous data, and wherein storing the data in the first group comprises reading and backing-up the previous data before erasing the first group, and, after erasing the first group, programming the first group with both the data and the backed-up previous data.

12. The method according to claim 1, wherein programming the first group comprises programming the memory cells in the first group to interim programming levels, subsequently programming at least one memory cell outside the first group, and subsequently re-programming the memory cells in the first group to final programming levels.

13. The method according to claim 12, wherein programming the first group to the interim programming levels comprises caching the data programmed to the first group in a buffer, and wherein re-programming the first group comprises re-programming the memory cells in the first group using the data cached in the buffer.

14. The method according to claim 1, wherein one of the first and second groups comprises the memory cells belonging to even-order word lines of the memory, and wherein the other of the first and second groups comprises the memory cells belonging to odd-order word lines of the memory.

15. The method according to claim 1, wherein the memory cells are arranged in rows associated with respective word lines, wherein one of the first and second groups comprises even-order memory cells in a given word line, and wherein the other of the first and second groups comprises odd-order memory cells in the given word line.

16. The method according to claim 1, wherein the memory is configurable to store the data in one of:
a first mode in which the first group is individually erased while subject to the interference from the second group; and
a second mode in which the first group is only erased during initialization of a memory block to which the first and second groups belong, and
wherein storing the data comprises accepting from a memory controller a command that indicates a selected one of the modes, and storing the data in the first group using the selected one of the modes.

17. Apparatus for data storage, comprising:
an interface, which is configured to accept data for storage in a memory that includes multiple analog memory cells; and
storage circuitry, which is configured to store the data in a first group of the memory cells by:
programming a second group of the memory cells to a predefined high interference-generating threshold voltage wherein the predefined high interference-generating threshold voltage generates interference from the second group to the first group;
individually erasing the first group without erasing the second group, thereby subjecting the first group to interference from the second group;
verifying that analog levels of the memory cells in the first group subject to the interference are within a predefined bound following erasure; and
after erasing the first group, programming the first group of the memory cells with the data.

18. The apparatus according to claim 17, wherein the memory cells are arranged in rows associated with respective word lines, wherein the first and second groups belong to first and second word lines, respectively, and wherein the storage circuitry is configured to individually erase the first group by individually erasing the first word line.

19. The apparatus according to claim 17, wherein the storage circuitry is configured to program the memory cells in the second group to the predefined interference-generating value in response to a command to store the data in the first group.

20. The apparatus according to claim 17, wherein the storage circuitry is configured to initialize at least part of a memory block that comprises the first and second groups to the interference-generating value.

21. The apparatus according to claim 20, wherein the storage circuitry is coupled to the memory, and is configured to accept an initialization command from a controller and to initialize at least the part of the memory block in response to the initialization command.

22. The apparatus according to claim 17, wherein the storage circuitry is configured to set one or more flags in the memory that indicate whether the second group is programmed to the predefined interference-generating value.

23. The apparatus according to claim 17, wherein the storage circuitry is configured to program multiple word lines of the memory concurrently to the interference-generating value.

24. The apparatus according to claim 23, wherein the storage circuitry is configured to program the multiple word lines by applying a single respective programming pulse to each of the multiple word lines.

25. The apparatus according to claim 17, wherein the storage circuitry is configured to program the second group to the interference-generating value by retaining programming levels that were programmed in the second group in a previous block programming operation.

26. The apparatus according to claim 17, wherein the storage circuitry is configured to program the memory cells of the second group with other data.

27. The apparatus according to claim 17, wherein the first group is previously programmed with previous data, and wherein the storage circuitry is configured to store the data in the first group by reading and backing-up the previous data before erasing the first group, and, after erasing the first group, programming the first group with both the data and the backed-up previous data.

28. The apparatus according to claim 17, wherein the storage circuitry is configured to program the memory cells in the first group to interim programming levels, to subsequently program at least one memory cell outside the first group, and to subsequently re-program the memory cells in the first group to final programming levels.

29. The apparatus according to claim 28, wherein the storage circuitry is configured to cache the data programmed to the first group in a buffer, and to re-program the memory cells in the first group using the data cached in the buffer.

30. The apparatus according to claim 17, wherein one of the first and second groups comprises the memory cells belonging to even-order word lines of the memory, and wherein the other of the first and second groups comprises the memory cells belonging to odd-order word lines of the memory.

31. The apparatus according to claim 17, wherein the memory cells are arranged in rows associated with respective word lines, wherein one of the first and second groups comprises even-order memory cells in a given word line, and wherein the other of the first and second groups comprises odd-order memory cells in the given word line.

32. The apparatus according to claim 17, wherein the storage circuitry is coupled to the memory, is configured to store the data in one of:
 a first mode in which the first group is individually erased while subject to the interference from the second group; and
 a second mode in which the first group is only erased during initialization of a memory block to which the first and second groups belong, and
 is configured to accept from a memory controller a command that indicates a selected one of the modes, and to store the data in the first group using the selected one of the modes.

33. Apparatus for data storage, comprising:
a memory comprising multiple analog memory cells; and
storage circuitry, which is configured to store data in a first group of the memory cells by:
 programming a second group of the memory cells to a predefined high interference-generating threshold voltage wherein the predefined high interference-generating threshold voltage generates interference from the second group to the first group;
 individually erasing the first group without erasing the second group, thereby subjecting the first group to interference from the second group;
 verifying that analog levels of the memory cells in the first group subject to the interference are within a predefined bound following erasure; and
 after erasing the first group, programming the first group of the memory cells with the data.

34. A method for data storage, comprising:
accepting data for storage in a memory that includes multiple analog memory cells; and
storing the data in a first group of the memory cells, by:
 programming a second group of the memory cells so as to cause the second group to generate interference in the first group;
 individually erasing the first group while verifying that analog levels of the memory cells in the first group subject to the interference are within a predefined bound following erasure;
 after erasing the first group, programming the first group of the memory cells with the data;
 wherein programming the second group comprises predefining an interference-generating value, and programming the memory cells in the second group to the predefined interference-generating value; and
 wherein programming the first group with the data comprises programming the first group using a first programming configuration having a first programming time, and wherein programming the second group to the interference-generating value comprises programming the second group using a second programming configuration having a second programming time, smaller than the first programming time.

35. Apparatus for data storage, comprising:
an interface, which is configured to accept data for storage in a memory that includes multiple analog memory cells; and
storage circuitry, which is configured to store the data in a first group of the memory cells by:
 programming a second group of the memory cells so as to cause the second group to generate interference the first group;
 individually erasing the first group while verifying that analog levels of the memory cells in the first group subject to the interference are within a predefined bound following erasure;
 after erasing the first group, programming the first group of the memory cells with the data;
 wherein the storage circuitry is configured to program the memory cells in the second group to a predefined interference-generating value; and
 wherein the storage circuitry is configured to program the first group with the data using a first programming configuration having a first programming time, and to program the second group to the interference-generating value using a second programming configuration having a second programming time, smaller than the first programming time.

36. Apparatus for data storage, comprising:
a memory comprising multiple analog memory cells; and
storage circuitry, which is configured to store data in a first group of the memory cells by:
  programming a second group of the memory cells so as to cause the second group to generate interference in the first group;
  individually erasing the first group while verifying that analog levels of the memory cells in the first group subject to the interference are within a predefined bound following erasure;
  after erasing the first group, programming the first group of the memory cells with the data;
  wherein the storage circuitry is configured to program the memory cells in the second group to a predefined interference-generating value; and
  wherein the storage circuitry is configured to program the first group with the data using a first programming configuration having a first programming time, and to program the second group to the interference-generating value using a second programming configuration having a second programming time, smaller than the first programming time.

\* \* \* \* \*